(12) United States Patent
Kawahara et al.

(10) Patent No.: US 11,387,174 B2
(45) Date of Patent: Jul. 12, 2022

(54) SEMICONDUCTOR DEVICE

(71) Applicant: Mitsubishi Electric Corporation, Tokyo (JP)

(72) Inventors: Kazuhiro Kawahara, Tokyo (JP); Toshitaka Sekine, Tokyo (JP); Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/135,160

(22) Filed: Dec. 28, 2020

(65) Prior Publication Data

US 2021/0375727 A1    Dec. 2, 2021

(30) Foreign Application Priority Data

May 28, 2020    (JP) .............................. JP2020-093227

(51) Int. Cl.
*H01L 23/495*    (2006.01)
*H01L 23/50*    (2006.01)
*H01L 23/28*    (2006.01)

(52) U.S. Cl.
CPC ........ *H01L 23/49551* (2013.01); *H01L 23/28* (2013.01); *H01L 23/49534* (2013.01); *H01L 23/49589* (2013.01); *H01L 23/50* (2013.01)

(58) Field of Classification Search
CPC ............... H01L 23/49551; H01L 23/28; H01L 23/49534; H01L 23/49589; H01L 23/50
See application file for complete search history.

(56) References Cited

U.S. PATENT DOCUMENTS

| | | | | |
|---|---|---|---|---|
| 5,309,021 | A | * | 5/1994 | Shimamoto ............ H05K 3/341 257/691 |
| 5,973,393 | A | * | 10/1999 | Chia .................... H01L 23/3107 257/672 |
| 6,310,390 | B1 | * | 10/2001 | Moden .................. H01L 21/561 257/668 |

FOREIGN PATENT DOCUMENTS

JP    H06-125035 A    5/1994

OTHER PUBLICATIONS

English Translation of JP2006196930, Funakoshi et al., published Jul. 27, 2006.*
English Translation of JP 2009105334, Meguro et al., published May 14, 2009.*

* cited by examiner

*Primary Examiner* — Peniel M Gumedzoe
(74) *Attorney, Agent, or Firm* — Studebaker & Brackett PC (57) ABSTRACT

A semiconductor device includes: a first semiconductor integrated circuit including at least a first terminal and a second terminal; a first lead frame connected to the first terminal; a second lead frame connected to the second terminal; and a mold resin covering the first semiconductor integrated circuit. The mold resin further covers the first lead frame with a portion of the first lead frame being exposed. The mold resin further covers the second lead frame with a tip of the second lead frame opposite to the second terminal being exposed. The mold resin includes a recess, and the recess is opened to expose only the portion and the mold resin.

9 Claims, 12 Drawing Sheets

SEMICONDUCTOR DEVICE

FIELD OF THE INVENTION

The present disclosure relates to a semiconductor device.

DESCRIPTION OF THE BACKGROUND ART

A semiconductor device including a semiconductor integrated circuit covered with a mold resin is known. The semiconductor device includes lead frames connected to the semiconductor integrated circuit. The tips of the lead frames opposite to the semiconductor integrated circuit are uncovered by the mold resin. The uncovered tips of the lead frames function as pins included in the semiconductor device.

A structure in which portions other than the tips of the lead frames are uncovered by the mold resin is known. For example, in Japanese Patent Application Laid-Open No. H6-125035 (Patent Document 1), three recesses are provided in a mold resin, and terminals are exposed in the respective recesses.

The terminals are for decoupling capacitors having a function of reducing power supply noise. Patent Document 1 exemplifies a case where a pair of terminals is provided in each of the recesses.

The fewer portions of the semiconductor device in which conductive components are uncovered by the mold resin are, the higher the moisture resistance of the semiconductor device is.

SUMMARY

This disclosure aims at providing a semiconductor device with high moisture resistance.

The semiconductor device according to the disclosure includes: a first semiconductor integrated circuit including at least a first terminal and a second terminal; a first lead frame connected to the first terminal; a second lead frame connected to the second terminal; and a mold resin covering the first semiconductor integrated circuit. The mold resin further covers the first lead frame with a portion of the first lead frame being exposed. The mold resin further covers the second lead frame with a tip of the second lead frame opposite to the second terminal being exposed. The mold resin includes a recess, and the recess is opened to expose only the portion and the mold resin.

The semiconductor device with high moisture resistance is obtained according to the disclosure.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
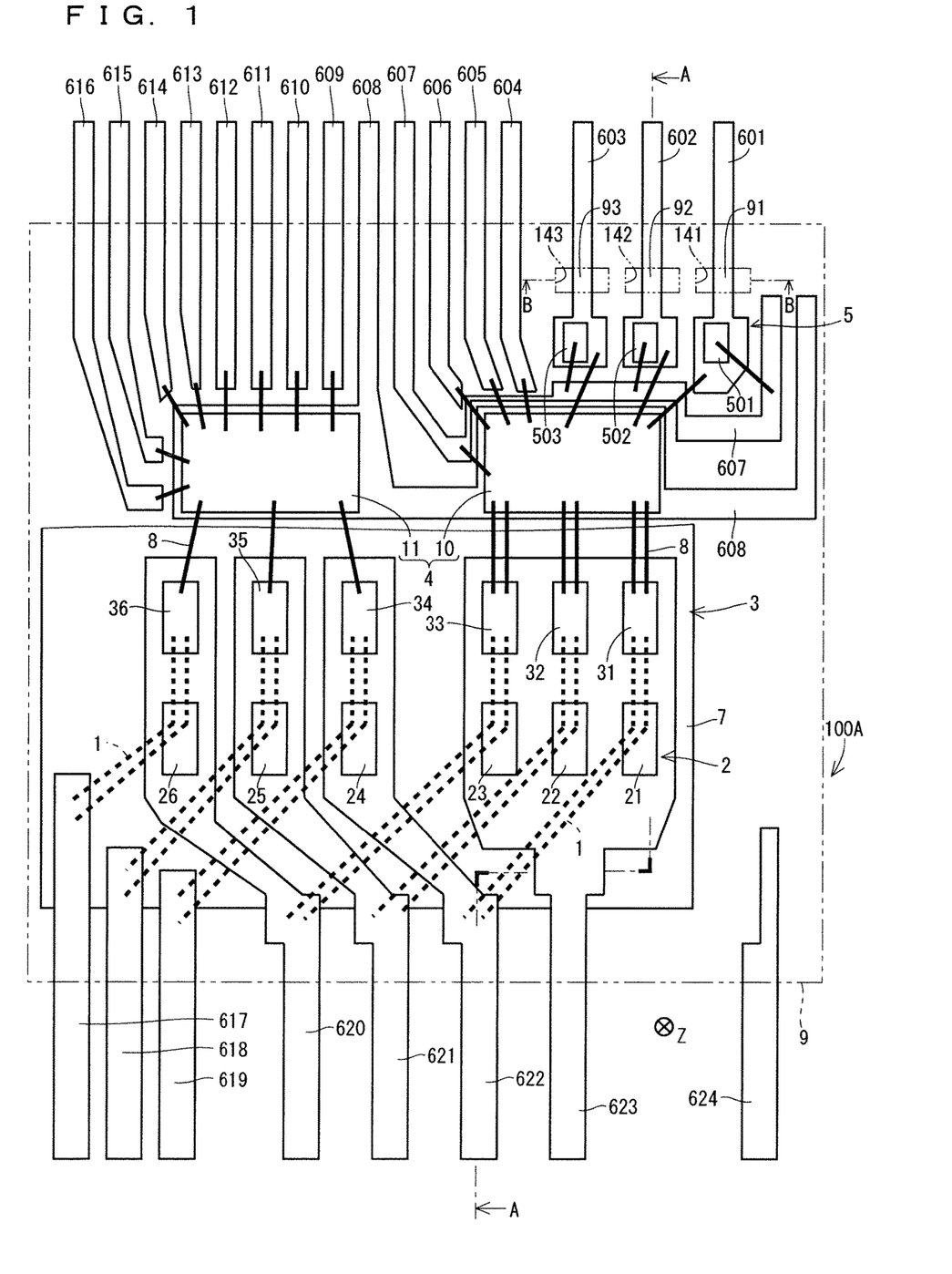
FIG. 1 is a plan view exemplifying a structure of a semiconductor device according to Embodiment 1.

FIG. 1 is a plan view exemplifying a structure of a semiconductor device 100A according to Embodiment 1. The semiconductor device 100A functions as an inverter that converts a DC voltage into a three-phase AC voltage. The semiconductor device 100A externally equipped with capacitors each generally called a boot strap capacitor (abbreviated as a "BSC") realizes a bootstrap circuit. The semiconductor device 100A is implemented as, for example, a transfer-molded intelligent power module (for example, DIPIPM (trademark)).

The semiconductor device 100A includes a plurality of first wires 1, a diode group 2, a switching element group 3, an integrated circuit group 4, an element group 5, lead frames 601 to 624, a sheet 7, a plurality of second wires 8, and a mold resin 9. The mold resin 9 is represented by a chain double-dashed line for better viewability.

The first wires 1 are schematically represented by thick broken lines in FIG. 1. The second wires 8 are schematically represented by thick solid lines in FIG. 1. All the first wires 1 are made of, for example, aluminum. All the second wires 8 are made of, for example, gold.

The diode group 2 includes diodes 21 to 26. The diodes 21 to 26 function as generally-called free-wheeling diodes in the three-phase inverter.

The switching element group 3 includes switching elements 31 to 36. The switching elements 31, 32, and 33 function as generally-called upper arms in the three-phase inverter. The switching elements 34, 35, and 36 function as generally-called lower arms in the three-phase inverter.

Each of the switching elements 31 to 36 is, for example, an insulated gate bipolar transistor, and is hereinafter abbreviated as "IGBT". The switching elements 31 to 36 may be field effect transistors.

A case where the switching elements 31 to 36 are the IGBTs will be hereinafter exemplified, and the switching elements may be referred to as the IGBTs. Each of the IGBTs 31 to 36 has an emitter, a collector, and a gate.

The integrated circuit group 4 includes semiconductor integrated circuits 10 and 11. The semiconductor integrated circuit 10 controls the switching elements 31, 32, and 33.

The semiconductor integrated circuit 10 functions as generally-called a high voltage integrated circuit (HVIC). The semiconductor integrated circuit 11 controls the switching elements 34, 35, and 36. The semiconductor integrated circuit 11 functions as generally-called a low voltage integrated circuit (LVIC).

The element group 5 includes diodes 501, 502, and 503. The diodes 501, 502, and 503 function as boot strap diodes that are paths for charging the BSCs. Each of the diodes 501, 502, and 503 includes a current-limiting resistor that limits a current in the charging.

The diode 501 is placed on the lead frame 601. The diode 501 is a chip diode, and its cathode is connected to the lead frame 601. The lead frame 607 is connected to the anode of the diode 501 through the second wire 8.

The diode 502 is placed on the lead frame 602. The diode 502 is a chip diode, and its cathode is connected to the lead frame 602. The lead frame 607 is connected to the anode of the diode 502 through the second wire 8.

The diode 503 is placed on the lead frame 603. The diode 503 is a chip diode, and its cathode is connected to the lead frame 603. The lead frame 607 is connected to the anode of the diode 503 through the second wire 8.

The lead frames 601 to 607 are connected to the semiconductor integrated circuit 10 through the second wires 8. Seven different terminals of the semiconductor integrated circuit 10 are associated with and connected to the lead frames 601 to 607 one by one.

The semiconductor integrated circuits 10 and 11 are placed on the lead frame 608. One electrode of the semiconductor integrated circuit 10 and one electrode of the semiconductor integrated circuit 11 are connected in common to the lead frame 608.

The lead frames 609 to 616 are connected to the semiconductor integrated circuit 11 through the second wires 8. Eight different terminals of the semiconductor integrated circuit 11 are associated with and connected to the lead frames 609 to 616 one by one.

The IGBT 36 and the diode 26 are placed on the lead frame 620. The collector of the IGBT 36 and the cathode of the diode 26 are connected to the lead frame 620.

The IGBT 35 and the diode 25 are placed on the lead frame 621. The collector of the IGBT 35 and the cathode of the diode 25 are connected to the lead frame 621.

The IGBT 34 and the diode 24 are placed on the lead frame 622. The collector of the IGBT 34 and the cathode of the diode 24 are connected to the lead frame 622.

The IGBTs 31, 32, and 33 and the diodes 21, 22, and 23 are placed on the lead frame 623. The collectors of the IGBTs 31, 32, and 33 and the cathodes of the diodes 21, 22, and 23 are connected to the lead frame 623. The diodes 21, 22, and 23 are connected in parallel to the switching elements 31, 32, and 33, respectively, with their conducting directions reversed. The lead frame 624 is not electrically connected to any other components.

The lead frame 617 is connected to the anode of the diode 26 and the emitter of the IGBT 36 through the first wires 1. The lead frame 618 is connected to the anode of the diode 25 and the emitter of the IGBT 35 through the first wires 1. The lead frame 619 is connected to the anode of the diode 24 and the emitter of the IGBT 34 through the first wires 1. The diodes 24, 25, and 26 are connected in parallel to the switching elements 34, 35, and 36, respectively, with their conducting directions reversed.

The sheet 7 has insulating properties. The lead frames 620, 621, 622, and 623 are placed on the sheet 7 at least at positions where the diode group 2 and the switching element group 3 are placed. The sheet 7 dissipates the heat of the diode group 2 and the switching element group 3.

The mold resin 9 covers the plurality of first wires 1, the diode group 2, the switching element group 3, the integrated circuit group 4, the element group 5, the sheet 7, and the plurality of second wires 8. The mold resin 9 partially covers the lead frames 601 to 624 so that the tips of the lead frames 601 to 624 are exposed.

The mold resin 9 includes recesses 141, 142, and 143. The recess 141 exposes a portion 91 of the lead frame 601. The recess 142 exposes a portion 92 of the lead frame 602. The recess 143 exposes a portion 93 of the lead frame 603.

Figure 2:
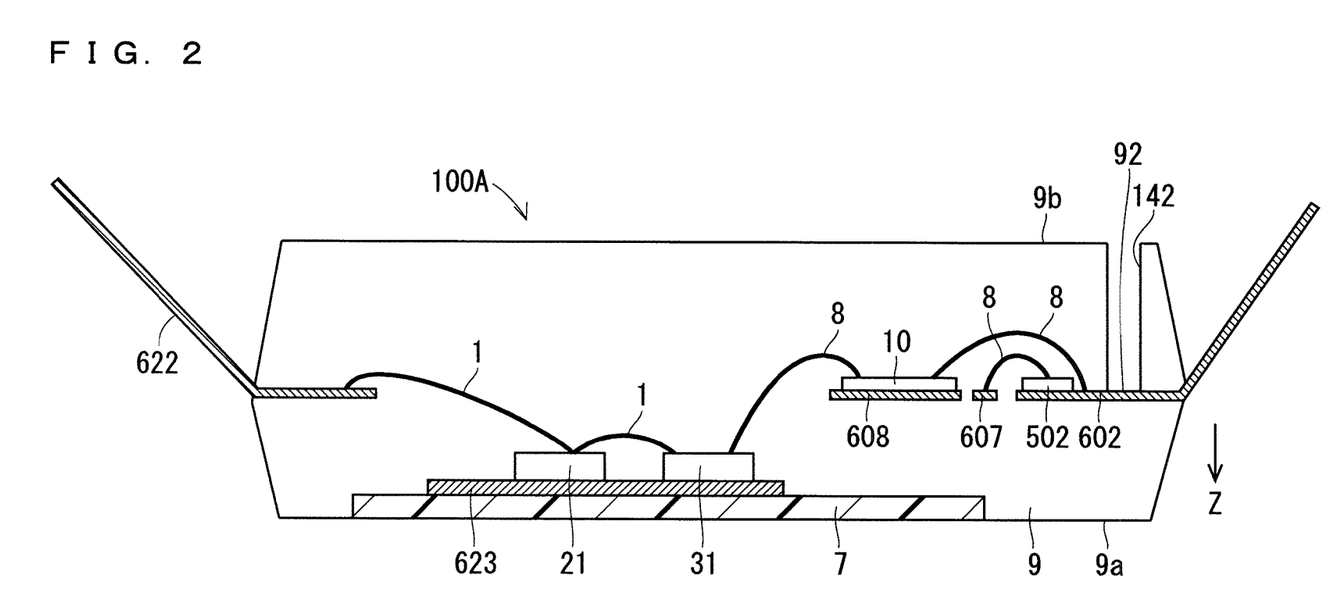
FIG. 2 is a cross-sectional view exemplifying a cross-section of the semiconductor device according to Embodiment 1 taken along the line AA of FIG. 1.

FIG. 2 is a cross-sectional view exemplifying a cross-section of the semiconductor device 100A taken along the line AA of FIG. 1. FIG. 2 illustrates the first wires 1 and the second wires 8 to exemplify the connectivity relationship for facilitating the understanding. FIG. 2 omits the hatching of the mold resin 9 to facilitate the understanding.

The mold resin 9 has surfaces 9a and 9b. For example, the sheet 7 may be exposed on the surface 9a. For example, a metal foil may be coated on the exposed surface of the sheet 7. FIG. 2 further illustrates a direction Z from the surface 9b to the surface 9a. FIG. 1 is depicted as a plan view when viewed along the direction Z.

The lead frames 601 to 624 (see FIG. 1) protrude from the mold resin 9 at positions between the surfaces 9a and 9b, and are bent in a direction opposite to the direction Z. The portions of the lead frames 601 to 624 that protrude from the mold resin 9 function as pins of the semiconductor device 100A.

The recess 142 is opened on the surface 9b to expose only the portion 92 and the mold resin 9. The recess 141 exposes only the portion 91 and the mold resin 9. The recess 143 exposes only the portion 93 and the mold resin 9.

Figure 3:
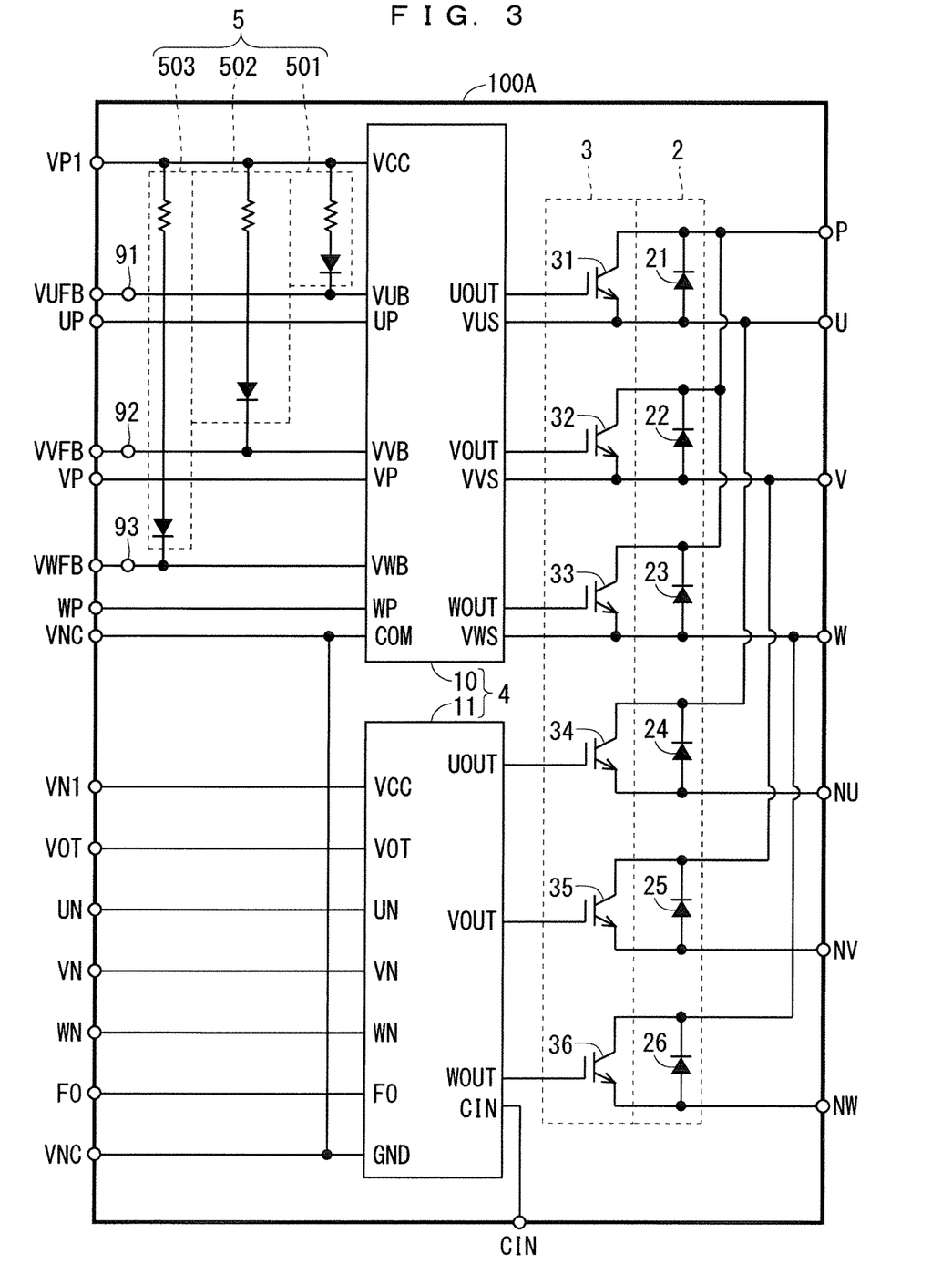
FIG. 3 is a circuit diagram exemplifying an electrical connectivity relationship of the semiconductor device according to Embodiment 1.

FIG. 3 is a circuit diagram exemplifying an electrical connectivity relationship of the semiconductor device 100A. The semiconductor device 100A includes terminals VUFB, VVFB, VWFB, UP, VP, WP, and VP1 as which the lead frames 601, 602, 603, 604, 605, 606, and 607 function, respectively. The semiconductor integrated circuit 10 includes terminals VCC, VUB, UP, VVB, VP, VWB, and WP which are connected to the lead frames 607, 601, 604, 602, 605, 603, and 606, respectively.

The semiconductor device 100A includes terminals UN, VN, WN, VN1, FO, CIN, and VOT as which the lead frames 609, 610, 611, 612, 613, 614, and 616 function, respectively. The semiconductor integrated circuit 11 includes terminals VCC, VOT, UN, VN, WN, FO, and CIN which are connected to the lead frames 612, 616, 609, 610, 611, 613, and 614, respectively.

The semiconductor device 100A includes the two terminals VNC. The semiconductor integrated circuit 10 includes a terminal COM. The semiconductor integrated circuit 11 includes a terminal GND. These terminals COM and GND are connected in common to one of the terminals VNC (the upper terminal VNC in FIG. 3). The lead frame 608 functions as this one of the terminals VNC.

The terminal GND of the semiconductor integrated circuit 11 is connected to the other terminal VNC (the lower terminal VNC in FIG. 3). The lead frame 615 functions as this other terminal VNC.

The semiconductor device 100A includes terminals NW, NV, NU, W, V, U, and P as which the lead frames 617, 618, 619, 620, 621, 622, and 623 function, respectively. The semiconductor integrated circuit 10 includes terminals VUS, VVS, and VWS which are connected to the lead frames 622, 621, and 620, respectively.

The semiconductor integrated circuit 10 includes terminals UOUT, VOUT, and WOUT. The terminals UOUT, VOUT, and WOUT of the semiconductor integrated circuit 10 are connected to the gates of the IGBTs 31, 32, and 33, respectively. Outputs from the terminals UOUT, VOUT, and WOUT of the semiconductor integrated circuit 10 control operations of the switching elements 31, 32, and 33, respectively.

The semiconductor integrated circuit 11 includes terminals UOUT, VOUT, and WOUT. The terminals UOUT, VOUT, and WOUT of the semiconductor integrated circuit 11 are connected to the gates of the IGBTs 34, 35, and 36, respectively. Outputs from the terminals UOUT, VOUT, and WOUT of the semiconductor integrated circuit 11 control operations of the switching elements 34, 35, and 36, respectively.

In FIG. 3, the portions 91, 92, and 93 are represented by open circles.

Connecting each BSC between the terminals VUB and VUS, between the terminals VVB and VVS, and between the terminals VWB and VWS of the semiconductor integrated circuit 10 realizes a bootstrap circuit using the semiconductor device 100A.

The BSC connected between the terminals VUB and VUS is connected in series with the diode 501 and the IGBT 34 between the terminals VP1 and NU of the semiconductor device 100A. Once the IGBT 34 is turned ON by a signal from the terminal UOUT of the semiconductor integrated circuit 11, the BSC is charged. Similarly, the BSC connected between the terminals VVB and VVS, and the BSC connected between the terminals VWB and VWS are charged. These BSCs cover the power consumption of the semiconductor integrated circuit 10.

Since the operations of the semiconductor integrated circuits 10 and 11 that work with the BSCs, the diode group 2, the switching element group 3, and the element group 5 are known, the details are omitted in this disclosure.

The portion 91 is uncovered by the mold resin 9, and the lead frame 601 including the portion 91 is connected to the terminal VUB. The BSC connected between the terminals VUB and VUS has two electrodes, i.e., a first end connected to the portion 91 and a second end connected to the terminal VUS through the lead frame 622 and a wire connected to the lead frame 622 outside of the semiconductor device 100A.

The portion 92 is uncovered by the mold resin 9, and the lead frame 602 including the portion 92 is connected to the terminal VVB. The BSC connected between the terminals VVB and VVS has two electrodes, i.e., a first end connected to the portion 92 and a second end connected to the terminal VVS through the lead frame 621 and a wire connected to the lead frame 621 outside of the semiconductor device 100A.

The portion 93 is uncovered by the mold resin 9, and the lead frame 603 including the portion 93 is connected to the terminal VWB. The BSC connected between the terminals VWB and VWS has two electrodes, i.e., a first end connected to the portion 93 and a second end connected to the terminal VWS through the lead frame 620 and a wire connected to the lead frame 620 outside of the semiconductor device 100A.

When a bootstrap circuit is realized using the semiconductor device 100A, the semiconductor device 100A need not always include the terminals VUFB, VVFB, and VWFB. The tips of the lead frames 601, 602, and 603 need not be uncovered by the mold resin 9.

Figure 4:
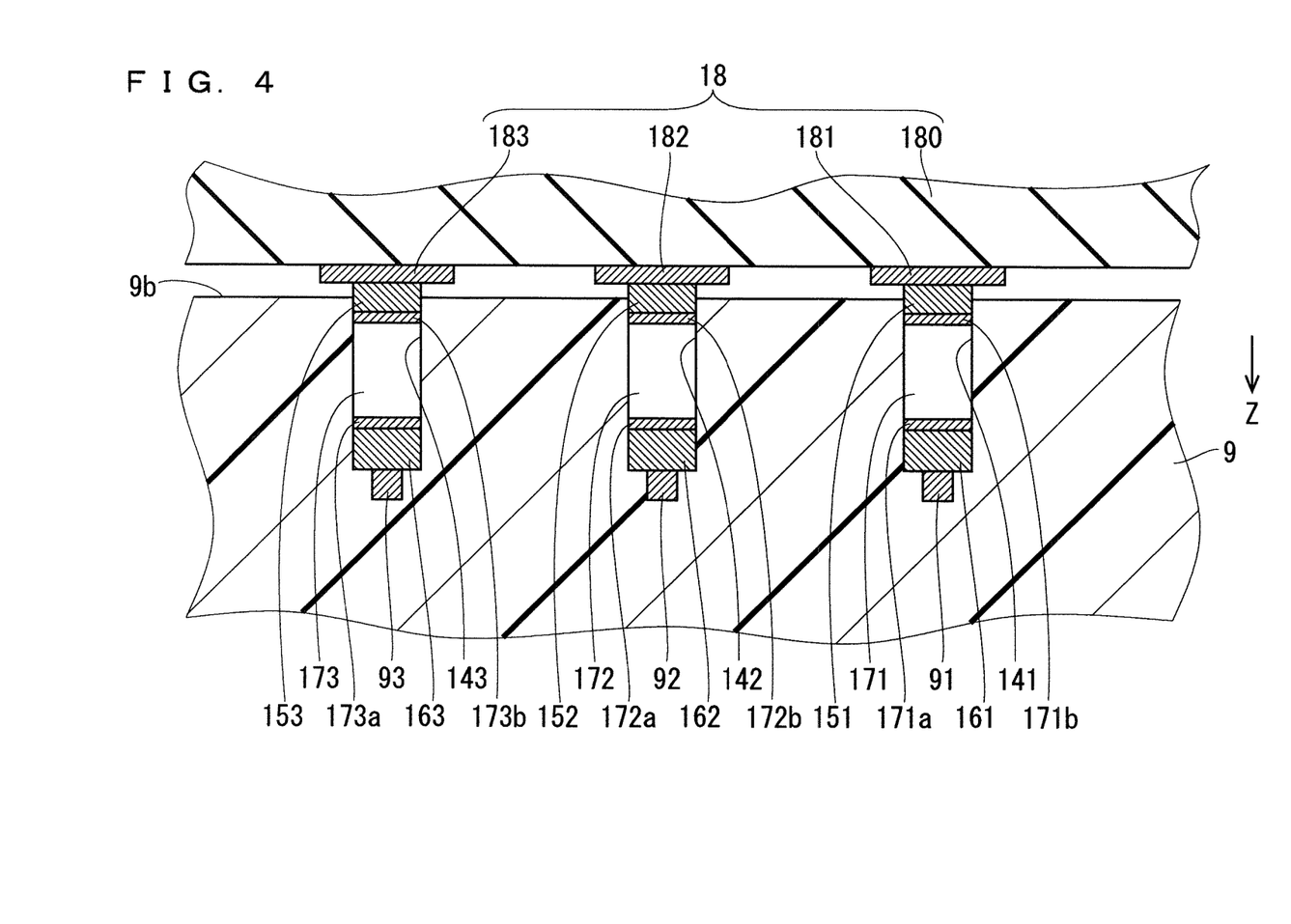
FIG. 4 is a cross-sectional view exemplifying a part of a cross-section of the semiconductor device according to Embodiment 1 taken along the line BB of FIG. 1.

FIG. 4 is a cross-sectional view exemplifying a part of a cross-section of the semiconductor device 100A taken along the line BB of FIG. 1, together with a part of a cross-section of a wiring board 18.

The wiring board 18 includes wires 181, 182, and 183, and an insulating board 180. The wires 181, 182, and 183 are provided on the same side as that of the board 180. The wiring board 18 faces the surface 9b with the wires 181, 182, and 183 being directed toward the surface 9b.

All capacitors 171, 172, and 173 function as the BSCs. The capacitors 171, 172, and 173 are, for example, chip capacitors.

The capacitor 171 has an end 171a (corresponding to the first end of the BSC) and an end 171b (corresponding to the second end of the BSC). The recess 141 is shaped to accommodate at least a part of the capacitor 171. In the example of FIG. 4, the recess 141 accommodates the capacitor 171. The direction Z can be regarded as a depth direction of the recess 141. For example, the direction from the end 171b to the end 171a is equal to the direction Z. The end 171a is electrically connected to the portion 91 through a conductor 161. The end 171b is electrically connected to the wire 181 through a conductor 151.

The capacitor 172 has an end 172a (corresponding to the first end of the BSC) and an end 172b (corresponding to the second end of the BSC). The recess 142 is shaped to accommodate at least a part of the capacitor 172. In the example of FIG. 4, the recess 142 accommodates the capacitor 172. The direction Z can be regarded as a depth direction of the recess 142. For example, the direction from the end 172b to the end 172a is equal to the direction Z. The end 172a is electrically connected to the portion 92 through a conductor 162. The end 172b is electrically connected to the wire 182 through a conductor 152.

The capacitor 173 has an end 173a (corresponding to the first end of the BSC) and an end 173b (corresponding to the second end of the BSC). The recess 143 is shaped to accommodate at least a part of the capacitor 173. In the example of FIG. 4, the recess 143 accommodates the capacitor 173. Put it differently, the direction Z is a depth direction of the recess 143. For example, the direction from the end 173b to the end 173a is equal to the direction Z. The end 173a is electrically connected to the portion 93 through a conductor 163. The end 173b is electrically connected to the wire 183 through a conductor 153.

The conductors 151, 152, 153, 161, 162, and 163 are made of, for example, a solder. The use of the solder in the conductors 151, 152, 153, 161, 162, and 163 contributes to reflow soldering of the capacitors 171, 172, and 173.

Figure 5:
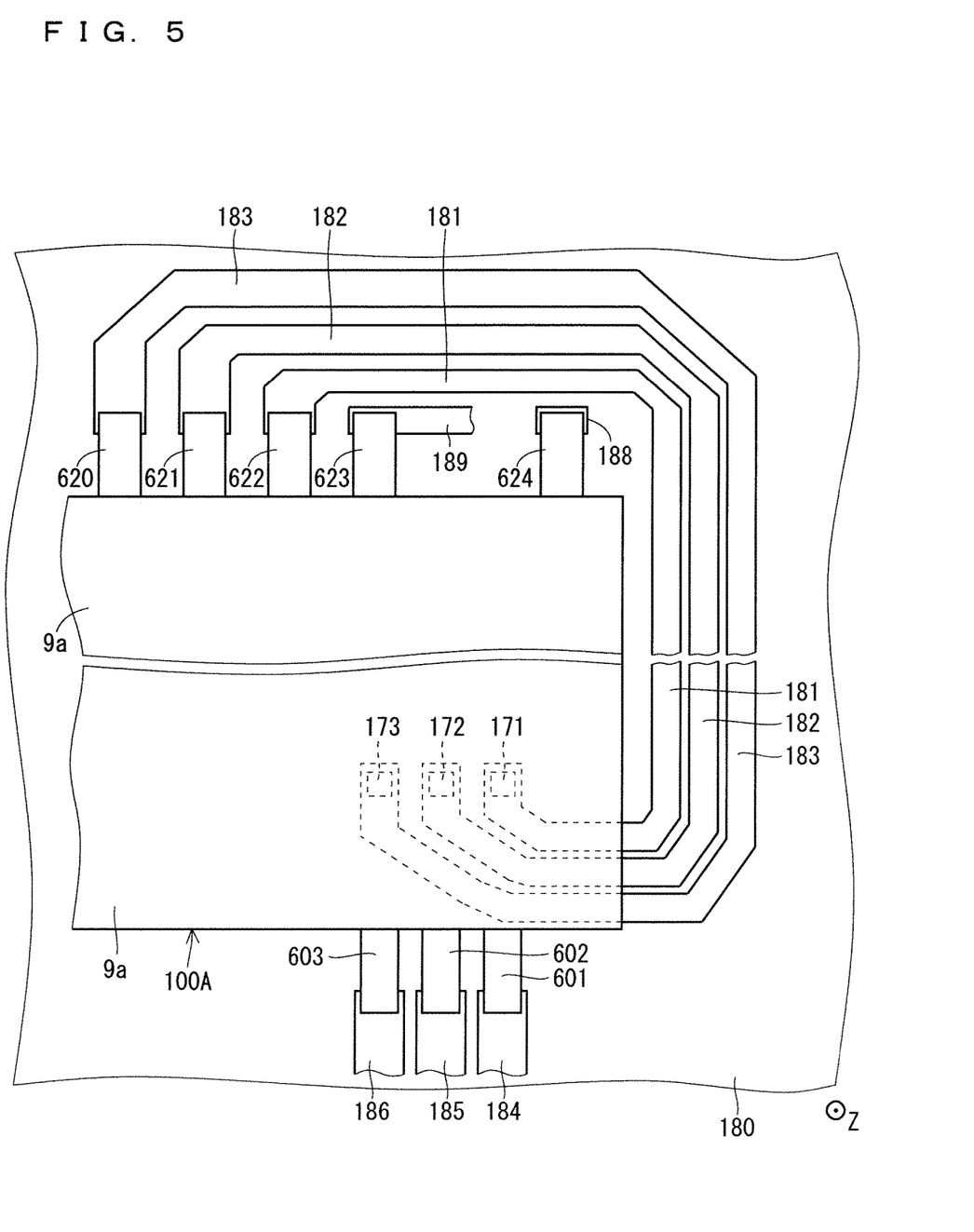
FIG. 5 is a plan view partially exemplifying a connectivity relationship between the semiconductor device and wires according to Embodiment 1.

FIG. 5 is a plan view partially exemplifying a connectivity relationship between the semiconductor device 100A and the wires 181, 182, and 183. FIG. 5 is depicted as a plan view when viewed along the direction opposite to the direction Z. Put it differently, FIG. 5 is a plan view when viewed along a direction from the semiconductor device 100A to the board 180.

The wire 181 connects the tip of the lead frame 622 to the capacitor 171 (specifically, the end 171b). The wire 182 connects the tip of the lead frame 621 to the capacitor 172 (specifically, the end 172b). The wire 183 connects the tip of the lead frame 620 to the capacitor 173 (specifically, the end 173b). The hidden lines in FIG. 5 are illustrated only for the wires 181, 182, and 183 and the capacitors 171, 172, and 173, which avoid the complicated illustration.

FIG. 5 also illustrates wires 184, 185, 186, 189, and 188 that are connected to the lead frames 601, 602, 603, 623, and 624, respectively. The wires 184, 185, 186, 188, and 189 are provided on the board 180 on the same side as that of the wires 181, 182, and 183. The wire 188 is, for example, a land. FIG. 5 exemplifies the placement of the wires 181, 182, and 183 having routes bypassing the semiconductor device 100A in a plan view. The wires 181, 182, and 183 may be placed without the bypassing routes.

The wire 181 connects the lead frame 622 to the end 171b of the capacitor 171. As illustrated in FIG. 4, the portion 91 is connected to the end 171a of the capacitor 171. As illustrated in FIG. 3, the portion 91 is connected to the terminal VUB of the semiconductor integrated circuit 10. As illustrated in FIG. 3, the terminal VUS of the semiconductor integrated circuit 10 is connected to the terminal U of the semiconductor device 100A. The lead frame 622 functions as the terminal U. The capacitor 171 is connected between the terminals VUB and VUS of the semiconductor integrated circuit 10 through the portion 91, the wire 181, and the lead frame 622, and functions as a BSC.

Similarly, the capacitor 172 is connected between the terminals VVB and VVS of the semiconductor integrated circuit 10 through the portion 92, the wire 182, and the lead frame 621, and functions as a BSC. Similarly, the capacitor 173 is connected between the terminals VWB and VWS of the semiconductor integrated circuit 10 through the portion 93, the wire 183, and the lead frame 620, and functions as a BSC.

[Description of Features 1A]

The features of the semiconductor device 100A can be described as follows. The semiconductor device 100A includes the semiconductor integrated circuit 10, the lead frames 601 and 622, and the mold resin 9. The mold resin 9 covers the semiconductor integrated circuit 10.

The semiconductor integrated circuit 10 includes at least the terminals VUB and VUS. The lead frame 601 is connected to the terminal VUB. The lead frame 622 is connected to the terminal VUS. The mold resin 9 also covers the lead frame 601, and the portion 91 of the lead frame 601 is exposed. The mold resin 9 also covers the lead frame 622, and the tip of the lead frame 622 opposite to the terminal VUS is exposed.

The mold resin 9 includes the recess 141. The recess 141 is opened to expose only the portion 91 and the mold resin 9.

These features contribute to the function of the portion 91 as a terminal to be connected to the end 171a of the capacitor 171. The end 171b of the capacitor 171 is connected to, for example, the lead frame 622 through the wire 181 provided outside of the semiconductor device 100A.

The description above is valid even using the following association by reading: the lead frames 601 and 622 as the lead frames 602 and 621, respectively; the terminals VUB and VUS as the terminals VVB and VVS, respectively; the recess 141 and the portion 91 as the recess 142 and the portion 92, respectively; the capacitor 171 and the ends 171a and 171b as the capacitor 172 and the ends 172a and 172b, respectively; and the wire 181 as the wire 182.

Alternatively, the description above is valid even using the following association by reading: the lead frames 601 and 622 as the lead frames 603 and 620, respectively; the terminals VUB and VUS as the terminals VWB and VWS, respectively; the recess 141 and the portion 91 as the recess 143 and the portion 93, respectively; the capacitor 171 and the ends 171a and 171b as the capacitor 173 and the ends 173a and 173b, respectively; and the wire 181 as the wire 183.

The terminal exposed in the recess 141 is the portion 91, the terminal exposed in the recess 142 is the portion 92, and the terminal exposed in the recess 143 is the portion 93. The portions of each of the lead frames uncovered by the mold resin 9 per recess are few. Thus, the semiconductor device 100A has high moisture resistance.

[Description of Features 2A]

The features of the semiconductor device 100A can be further described as follows. The semiconductor device 100A further includes the diode 501, the semiconductor integrated circuit 11, the lead frames 619 and 623, and the switching elements 31 and 34. The semiconductor integrated circuit 10 further includes the terminal VCC.

The diode 501 has the anode, and the cathode connected to the lead frame 601. The terminal VCC is connected to the anode of the diode 501. In the exemplification, the terminal VCC is connected to the anode of the diode 501 through the lead frame 607.

The mold resin 9 covers the switching elements 31 and 34. The switching element 31 is connected between the lead frames 623 and 622. The switching element 34 is connected between the lead frames 622 and 619.

The switching element 31 is controlled by the semiconductor integrated circuit 10. The switching element 34 is controlled by the semiconductor integrated circuit 11.

The recess 141 is shaped to accommodate at least a part of the capacitor 171. The capacitor 171 is charged through the diode 501 by rendering the switching element 34 conductive. The capacitor 171 functions as, for example, a BSC.

The description above is valid even using the following association by reading: the diode 501 as the diode 502; the lead frames 601, 619, and 622 as the lead frames 602, 618, and 621, respectively; the switching elements 31 and 34 as the switching elements 32 and 35, respectively; and the recess 141 and the capacitor 171 as the recess 142 and the capacitor 172, respectively.

Alternatively, the description above is valid even using the following association by reading: the diode 501 as the diode 503; the lead frames 601, 619, and 622 as the lead frames 603, 617, and 620, respectively; the switching elements 31 and 34 as the switching elements 33 and 36, respectively; and the recess 141 and the capacitor 171 as the recess 143 and the capacitor 173, respectively.

[Description of Features 3]

The features of the semiconductor device 100A can be further described as follows. The tip of the lead frame 601 opposite to the terminal VUB, the tip of the lead frame 602 opposite to the terminal VVB, and the tip of the lead frame 603 opposite to the terminal VWB are uncovered by the mold resin 9. The portion 91 is interposed between the tip of the lead frame 601 and the terminal VUB. The portion 92 is interposed between the tip of the lead frame 602 and the terminal VVB. The portion 93 is interposed between the tip of the lead frame 603 and the terminal VWB.

External application of a voltage from the semiconductor device 100A to the lead frames 601, 602, and 603 covers the power consumption of the semiconductor integrated circuit 10 without using the BSCs. Specifically, a DC voltage is applied, for example, between the lead frames 601 and 622, between the lead frames 602 and 621, and between the lead frames 603 and 620.

[Modifications]

Figure 6:
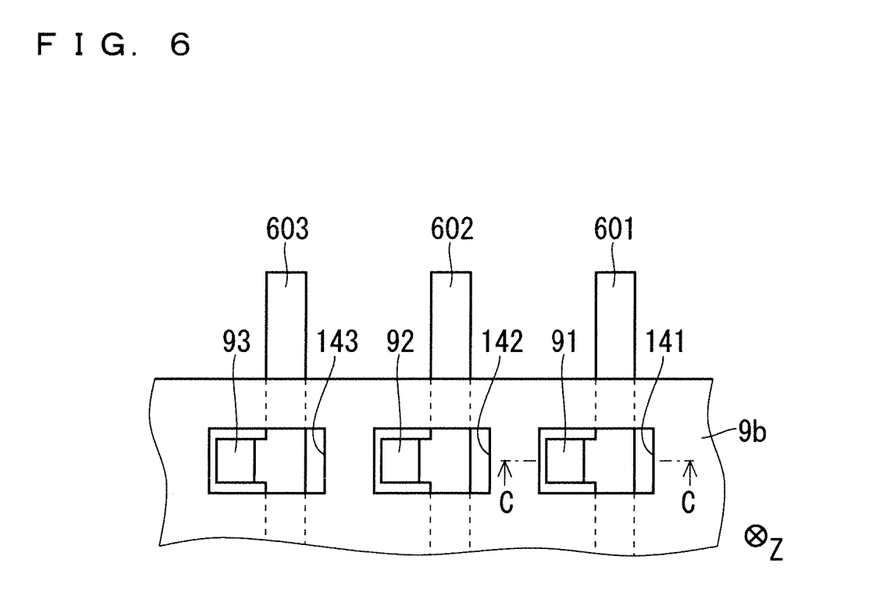
FIG. 6 is a plan view exemplifying a modification of the semiconductor device according to Embodiment 1.

The shape of the portions 91, 92, and 93 that are exposed in the recesses 141, 142, and 143, respectively may be appropriately designed. FIG. 6 is a plan view exemplifying a modification of the semiconductor device according to Embodiment 1.

FIG. 6 illustrates only the recesses 141, 142, and 143 and the proximity thereof. In FIG. 6, the surface 9b faces the viewer.

Figure 7:
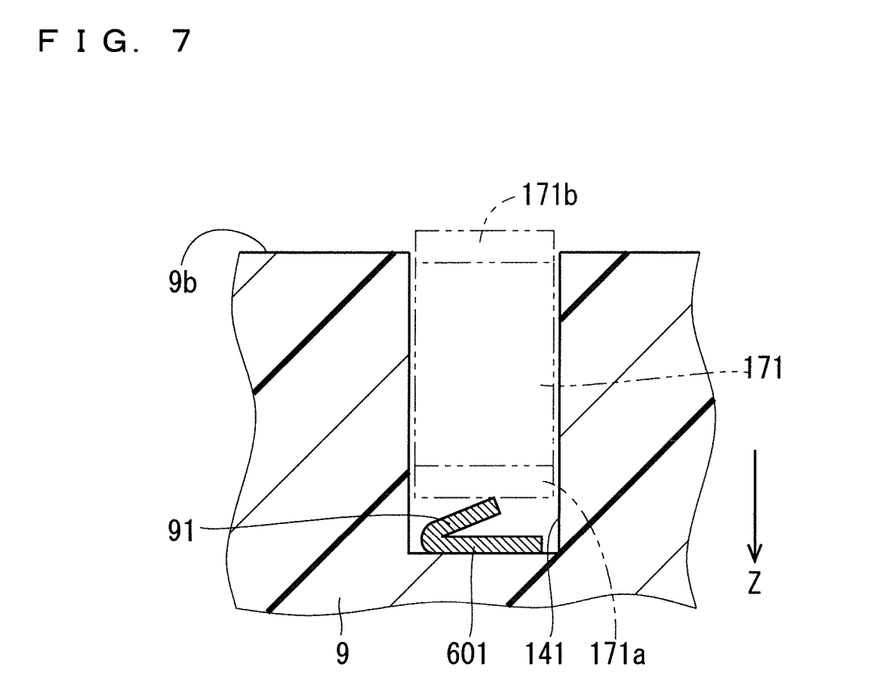
FIG. 7 is a cross-sectional view partially exemplifying a cross-section taken along the line CC of FIG. 6.

FIG. 7 is a cross-sectional view partially exemplifying a cross-section taken along the line CC of FIG. 6. FIG. 7 illustrates positions of the capacitor 171 and the ends 171a and 171b using virtual chain double-dashed lines.

The portion 91 is bent in the recess 141. Specifically, the portion 91 includes, for example, a plurality of layers when viewed along the direction Z. As such, the bent portion 91 functions as a leaf spring. When the recess 141 houses at least a part of the capacitor 171 and the portion 91 is pressed in the direction Z, the portion 91 exerts a force on the capacitor 171 in the direction opposite to the direction Z. This force presses the capacitor 17, specifically, the end 171b against the wire 181 (see FIG. 4).

The portion 91 functioning as a leaf spring contributes to the technology of connecting the capacitor 171 between the lead frame 601 and the wire 181 without using the conductors 161 and 151 (see FIG. 4).

The portion 92 is bent and functions as a leaf spring in the recess 142, similarly to the portion 91 in the recess 141. This function contributes to the technology of connecting the capacitor 172 between the lead frame 602 and the wire 182 without using the conductors 162 and 152 (see FIG. 4).

The portion 93 is bent and functions as a leaf spring in the recess 143, similarly to the portion 91 in the recess 141. This function contributes to the technology of connecting the capacitor 173 between the lead frame 603 and the wire 183 without using the conductors 163 and 153 (see FIG. 4).

FIG. 6 exemplifies a case where directions in which the portions 91, 92, and 93 are bent are aligned. The directions need not be aligned.

Embodiment 2

Figure 8:
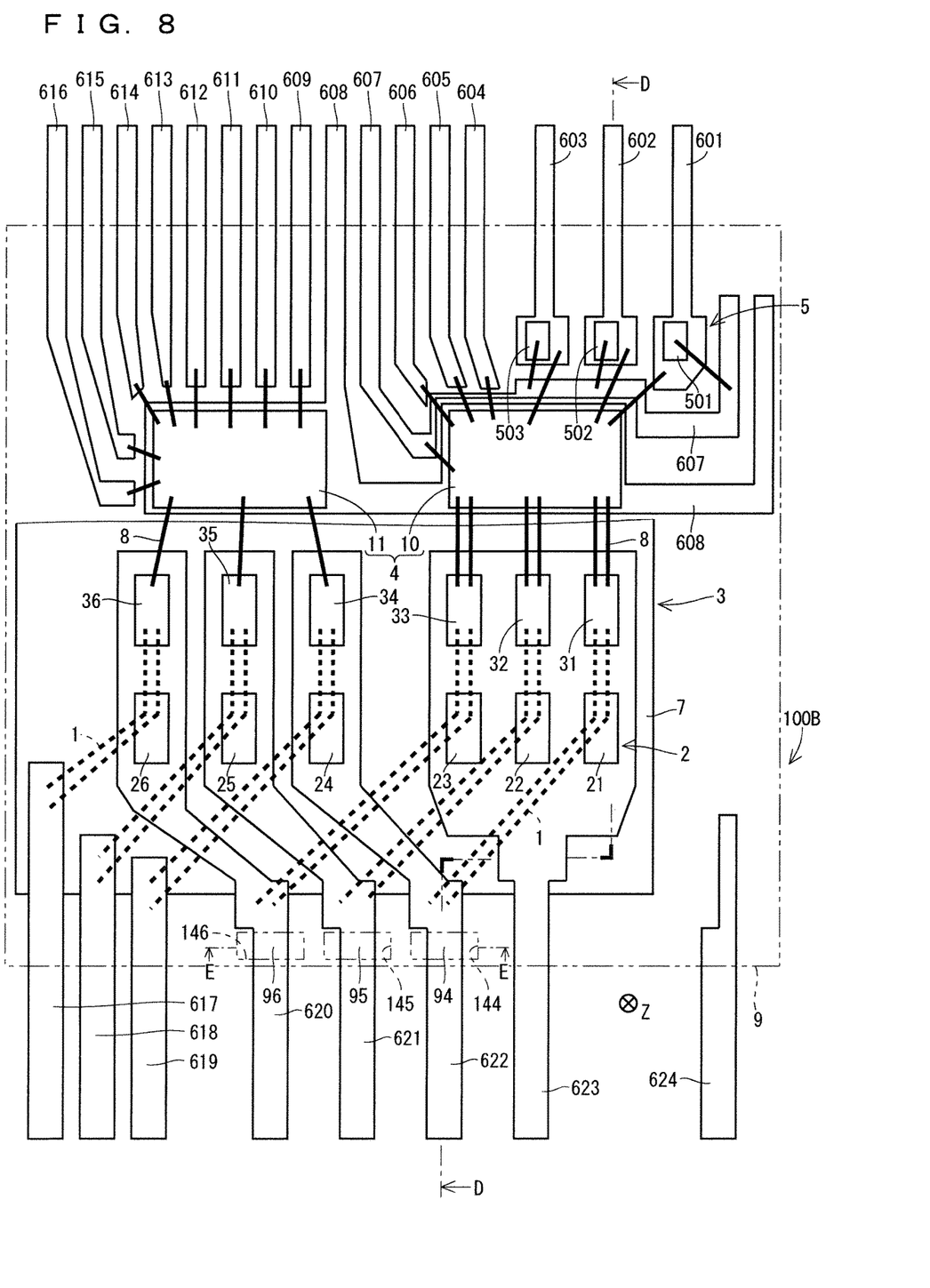
FIG. 8 is a plan view exemplifying a structure of a semiconductor device according to Embodiment 2.

FIG. 8 is a plan view exemplifying a structure of a semiconductor device 100B according to Embodiment 2. The semiconductor device 100B also functions as an inverter that converts a DC voltage into a three-phase AC voltage similarly to the semiconductor device 100A. The semiconductor device 100B externally equipped with BSCs realizes a bootstrap circuit. The semiconductor device 100B is implemented as, for example, a transfer-molded intelligent power module (for example, DIPIPM (trademark)).

The semiconductor device 100B differs from the semiconductor device 100A by exposing a portion 94 of the lead frame 622, a portion 95 of the lead frame 621, and a portion 96 of the lead frame 620, instead of the portions 91, 92, and 93 uncovered by the mold resin 9. Otherwise, the semiconductor device 100B has a structure common to that of the semiconductor device 100A.

The mold resin 9 includes recesses 144, 145, and 146. The recess 144 exposes the portion 94. The recess 145 exposes the portion 95. The recess 146 exposes the portion 96. FIG. 8 also illustrates the mold resin 9 using the chain double-dashed line.

Figure 9:
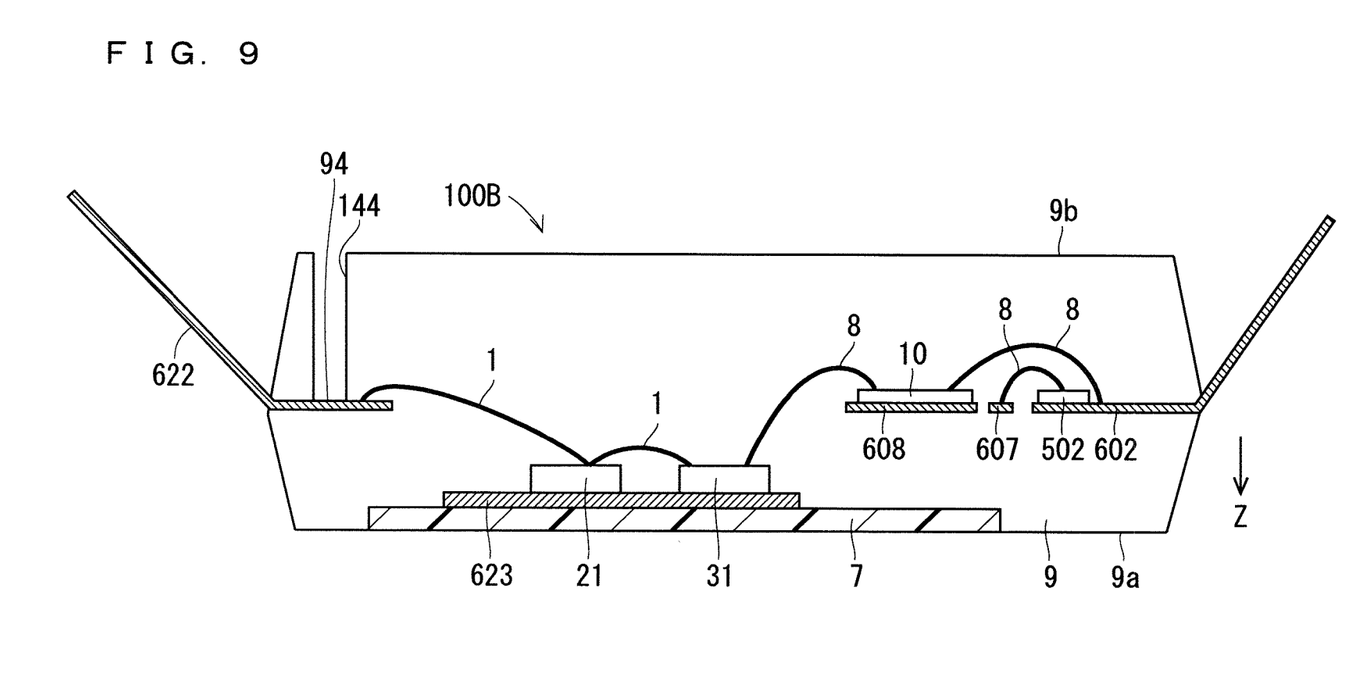
FIG. 9 is a cross-sectional view exemplifying a cross-section of the semiconductor device according to Embodiment 2 taken along the line DD of FIG. 8.

FIG. 9 is a cross-sectional view exemplifying a cross-section of the semiconductor device 100B taken along the line DD of FIG. 8. FIG. 9 illustrates the first wires 1 and the second wires 8 to exemplify the connectivity relationship for facilitating the understanding. FIG. 9 omits the hatching of the mold resin 9 to facilitate the understanding. FIG. 8 is depicted as a plan view when viewed along the direction Z.

Figure 10:
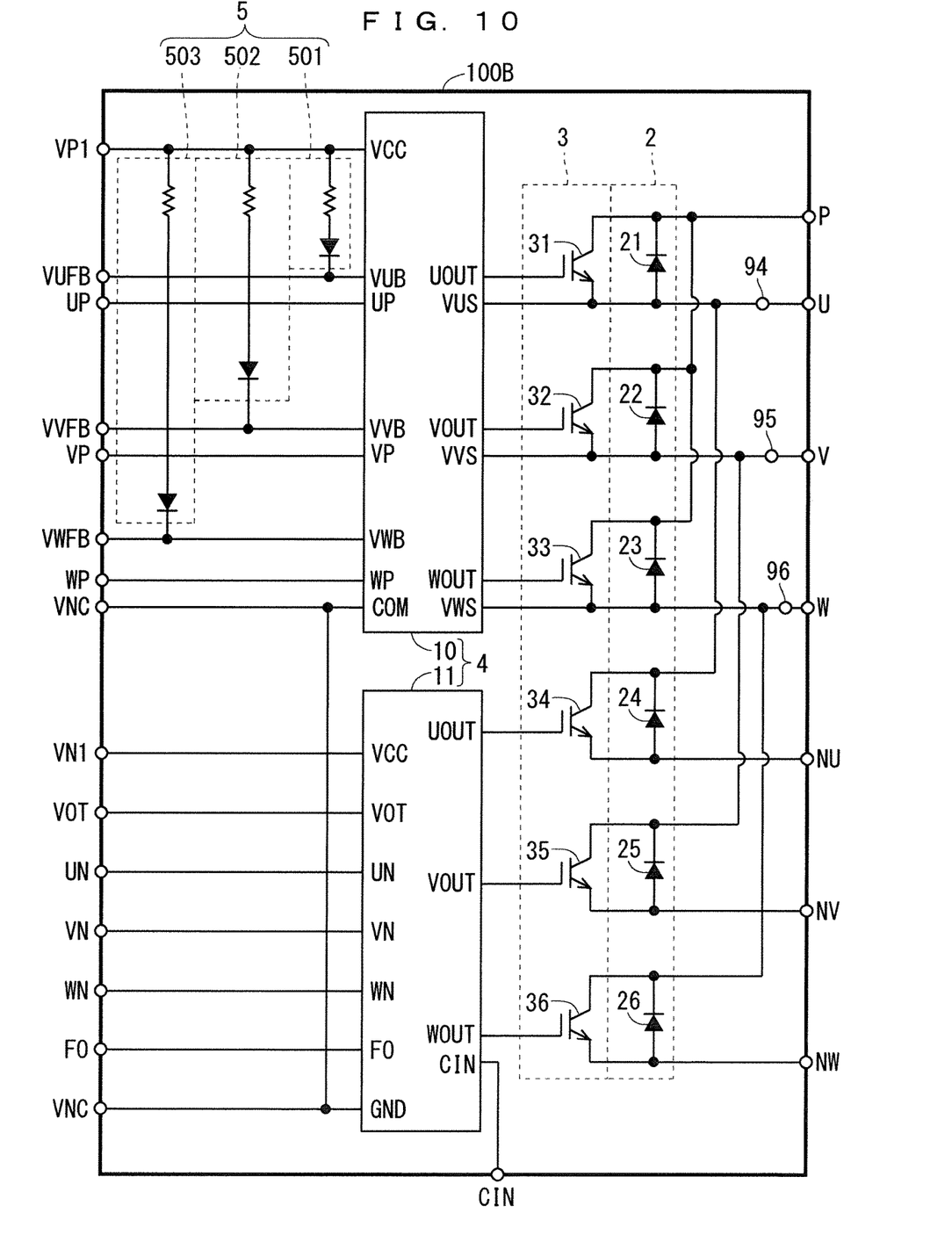
FIG. 10 is a circuit diagram exemplifying an electrical connectivity relationship of the semiconductor device according to Embodiment 2.

FIG. 10 is a circuit diagram exemplifying an electrical connectivity relationship of the semiconductor device 100B. In FIG. 10, the portions 94, 95, and 96 are represented by open circles.

Figure 11:
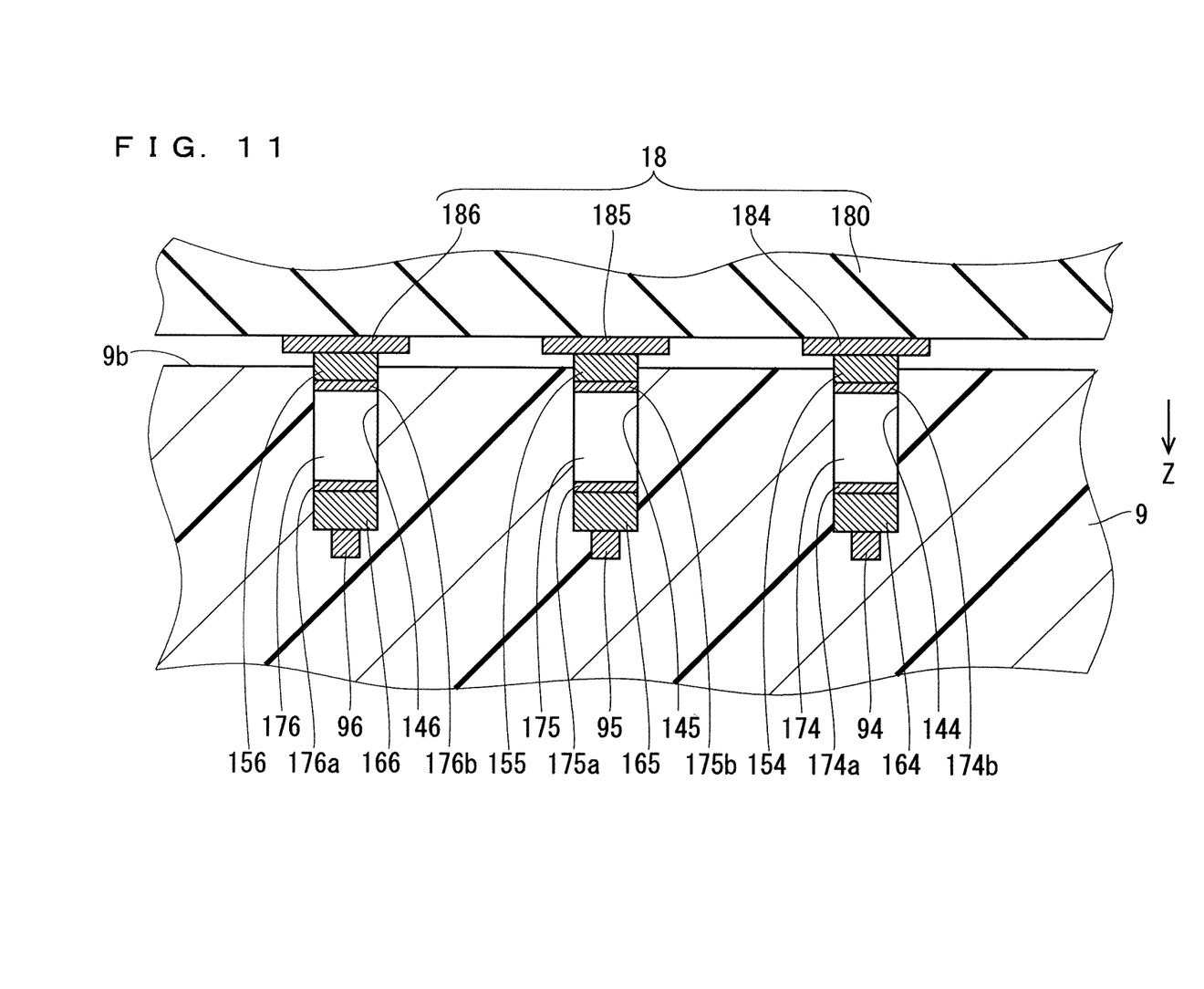
FIG. 11 is a cross-sectional view exemplifying a part of a cross-section of the semiconductor device according to Embodiment 2 taken along the line EE of FIG. 8.

FIG. 11 is a cross-sectional view exemplifying a part of a cross-section of the semiconductor device 100B taken along the line EE of FIG. 8, together with a part of a cross-section of the wiring board 18.

The wiring board 18 includes wires 184, 185, and 186, and the insulating board 180. The wires 184, 185, and 186 are provided on the same side as that of the board 180. The wiring board 18 faces the surface 9b with the wires 184, 185, and 186 being directed toward the surface 9b.

All capacitors 174, 175, and 176 function as BSCs. The capacitors 174, 175, and 176 are, for example, chip capacitors.

The capacitor 174 has an end 174a and an end 174b. For example, the direction from the end 174b to the end 174a is equal to the direction Z. The end 174a is electrically connected to the portion 94 through a conductor 164. The end 174b is electrically connected to the wire 184 through a conductor 154. The recess 144 is shaped to accommodate at least a part of the capacitor 174. In the example of FIG. 11, the recess 144 accommodates the capacitor 174.

The capacitor 175 has an end 175a and an end 175b. For example, the direction from the end 175b to the end 175a is equal to the direction Z. The end 175a is electrically connected to the portion 95 through a conductor 165. The end 175b is electrically connected to the wire 185 through a conductor 155. The recess 145 is shaped to accommodate at least a part of the capacitor 175. In the example of FIG. 11, the recess 145 accommodates the capacitor 175.

The capacitor 176 has an end 176a and an end 176b. For example, the direction from the end 176b to the end 176a is equal to the direction Z. The end 176a is electrically connected to the portion 96 through a conductor 166. The end 176b is electrically connected to the wire 186 through a conductor 156. The recess 146 is shaped to accommodate at least a part of the capacitor 176. In the example of FIG. 11, the recess 146 accommodates the capacitor 176.

The conductors 154, 155, 156, 164, 165, and 166 are made of, for example, a solder. The use of the solder in the conductors 154, 155, 156, 164, 165, and 166 contributes to reflow soldering of the capacitors 174, 175, and 176.

Figure 12:
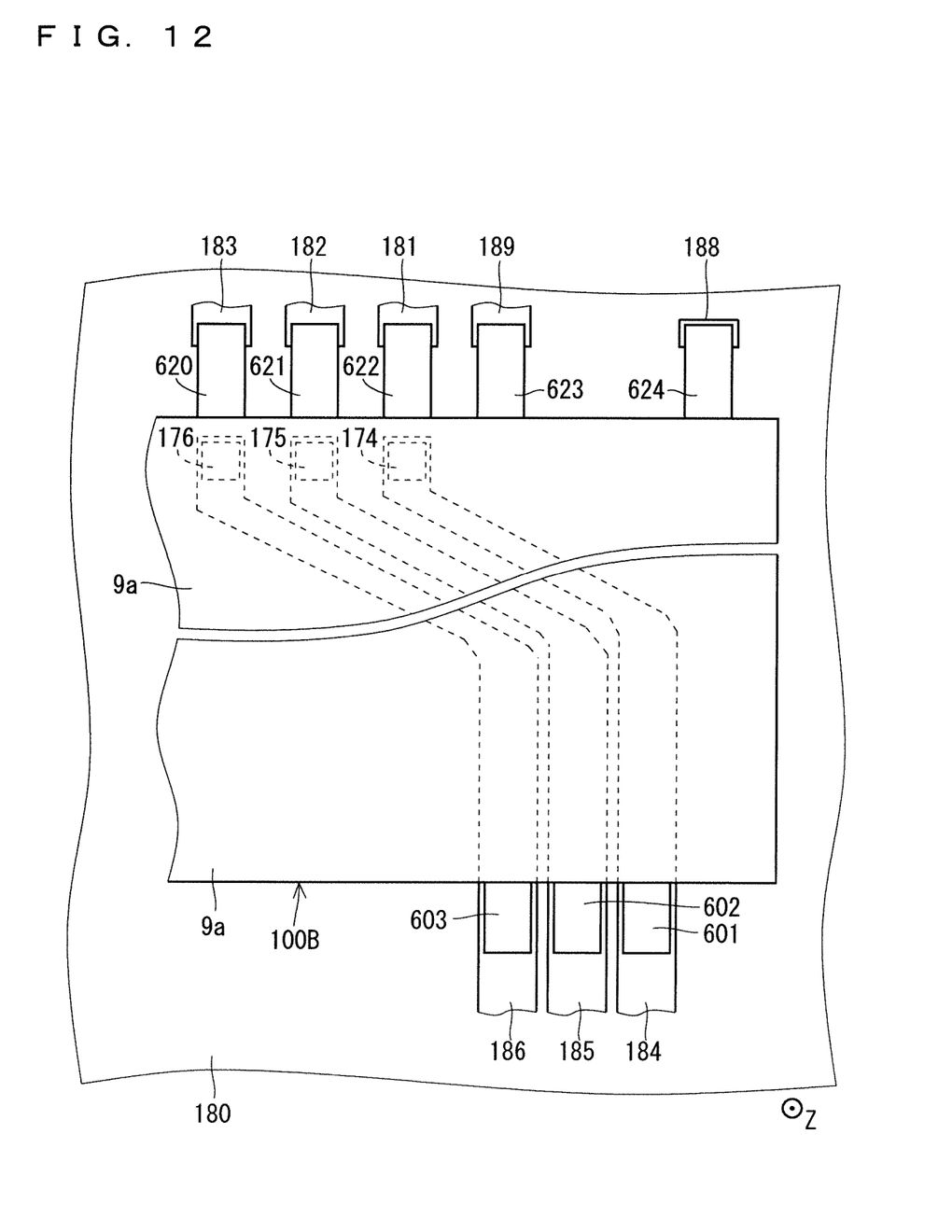
FIG. 12 is a plan view partially exemplifying a connectivity relationship between the semiconductor device and wires according to Embodiment 2.

FIG. 12 is a plan view partially exemplifying an electrical connectivity relationship between the semiconductor device 100B and the wires 184, 185, and 186. FIG. 12 is depicted as a plan view when viewed along the direction opposite to the direction Z. Put it differently, FIG. 12 is a plan view when viewed along a direction from the semiconductor device 100B to the board 180.

The wire 184 connects the tip of the lead frame 601 to the capacitor 174 (specifically, the end 174b). The wire 185 connects the tip of the lead frame 602 to the capacitor 175 (specifically, the end 175b). The wire 186 connects the tip of the lead frame 603 to the capacitor 176 (specifically, the end 176b). The hidden lines in FIG. 12 are illustrated only for the wires 184, 185, and 186 and the capacitors 174, 175, and 176, which avoid the complicated illustration.

FIG. 12 also illustrates the wires 183, 182, 181, 189, and 188 that are connected to the lead frames 620, 621, 622, 623, and 624, respectively. The wires 181, 182, 183, 188, and 189 are provided on the board 180 on the same side as that of the wires 184, 185, and 186. FIG. 12 exemplifies a case where the wires 184, 185, and 186 are sandwiched between the semiconductor device 100B and the board 180 in a plan view. The wires 184, 185, and 186 having routes bypassing the semiconductor device 100B in a plan view may be placed.

The wire 184 connects the tip of the lead frame 601 to the end 174b of the capacitor 174. As illustrated in FIG. 11, the portion 94 is connected to the end 174a of the capacitor 174. As illustrated in FIG. 10, the portion 94 is connected to the terminal VUS of the semiconductor integrated circuit 10. As illustrated in FIG. 10, the terminal VUB of the semiconductor integrated circuit 10 is connected to the terminal VUFB of the semiconductor device 100B. The lead frame 601 functions as the terminal VUFB. The capacitor 174 is connected between the terminals VUB and VUS of the semiconductor integrated circuit 10 through the portion 94, the wire 184, and the lead frame 601, and functions as a BSC.

Similarly, the capacitor 175 is connected between the terminals VVB and VVS of the semiconductor integrated circuit 10 through the portion 95, the wire 185, and the lead frame 602, and functions as a BSC. Similarly, the capacitor 176 is connected between the terminals VWB and VWS of the semiconductor integrated circuit 10 through the portion 96, the wire 186, and the lead frame 603, and functions as a BSC.

[Description of Features 1B]

The features of the semiconductor device 100B can be described as follows. The semiconductor device 100B includes the semiconductor integrated circuit 10, the lead frames 601 and 622, and the mold resin 9. The mold resin 9 covers the semiconductor integrated circuit 10.

The semiconductor integrated circuit 10 includes at least the terminals VUB and VUS. The lead frame 601 is connected to the terminal VUB. The lead frame 622 is connected to the terminal VUS. The mold resin 9 also covers the lead frame 622, and the portion 94 of the lead frame 622 is exposed. The mold resin 9 also covers the lead frame 601, and the tip of the lead frame 601 opposite to the terminal VUB is exposed.

The mold resin 9 includes the recess 144. The recess 144 is opened to expose only the portion 94 and the mold resin 9.

These features contribute to the function of the portion 94 as a terminal to be connected to the end 174a of the capacitor 174. The end 174b of the capacitor 174 is connected to, for example, the lead frame 601 through the wire 184 provided outside of the semiconductor device 100B.

The description above is valid even using the following association by reading: the lead frames 601 and 622 as the lead frames 602 and 621, respectively; the terminals VUB and VUS as the terminals VVB and VVS, respectively; the recess 144 and the portion 94 as the recess 145 and the portion 95, respectively; the capacitor 174 and the ends 174a and 174b as the capacitor 175 and the ends 175a and 175b, respectively; and the wire 184 as the wire 185.

The description above is valid even using the following association by reading: the lead frames 601 and 622 as the lead frames 603 and 620, respectively; the terminals VUB and VUS as the terminals VWB and VWS, respectively; the recess 144 and the portion 94 as the recess 146 and the portion 96, respectively; the capacitor 174 and the ends 174a and 174b as the capacitor 176 and the ends 176a and 176b, respectively; and the wire 184 as the wire 186.

The terminal exposed in the recess 144 is the portion 94, the terminal exposed in the recess 145 is the portion 95, and the terminal exposed in the recess 146 is the portion 96. The portions of each of the lead frames uncovered by the mold resin 9 per recess are few. Thus, the semiconductor device 100B has high moisture resistance.

[Description of Features 2B]

The features of the semiconductor device 100B can be further described as follows. The semiconductor device 100B includes the diode 501, the semiconductor integrated circuit 11, the lead frames 619 and 623, and the switching elements 31 and 34. The semiconductor integrated circuit 10 further includes the terminal VCC.

The diode 501 has the anode, and the cathode connected to the lead frame 601. The terminal VCC is connected to the anode of the diode 501. In the exemplification, the terminal VCC is connected to the anode of the diode 501 through the lead frame 607.

The mold resin 9 covers the switching elements 31 and 34. The switching element 31 is connected between the lead frames 623 and 622. The switching element 34 is connected between the lead frames 622 and 619.

The switching element 31 is controlled by the semiconductor integrated circuit 10. The switching element 34 is controlled by the semiconductor integrated circuit 11.

The recess 144 is shaped to accommodate at least a part of the capacitor 174. The capacitor 174 is charged through the diode 501 by rendering the switching element 34 conductive. The capacitor 174 functions as a BSC.

The description above is valid even using the following association by reading: the diode 501 as the diode 502; the lead frames 601, 619, and 622 as the lead frames 602, 618, and 621, respectively; the switching elements 31 and 34 as the switching elements 32 and 35, respectively; and the recess 144 and the capacitor 174 as the recess 145 and the capacitor 175, respectively.

Alternatively, the description above is valid even using the following association by reading: the diode 501 as the diode 503; the lead frames 601, 619, and 622 as the lead frames 603, 617, and 620, respectively; the switching elements 31 and 34 as the switching elements 33 and 36, respectively; and the recess 144 and the capacitor 174 as the recess 146 and the capacitor 176, respectively.

[Modifications]

The shape of the portions 94, 95, and 96 that are exposed in the recesses 144, 145, and 146, respectively may be appropriately designed. The portions 94, 95, and 96 may be bent in the recesses 144, 145, and 146, respectively, similarly to the portions 91, 92, and 93 exemplified in FIG. 7.

APPLICATION EXAMPLES

The switching elements 31 to 36, the diodes 501 to 503 and 21 to 26, and the semiconductor integrated circuits 10 and 11 are made of, for example, silicon (Si) or silicon carbide (SiC) as a semiconductor material.

The structure in which only a portion of one lead frame and a mold resin are exposed in one recess is applicable not only to a BSC but also to the other components such as a decoupling capacitor. One of ends of a pair of electrodes included in a decoupling capacitor is electrically connected to a portion exposed in a recess. The other end of the pair of electrodes is electrically connected to an external wire of a semiconductor device including a mold resin including the recess. The recess is shaped to accommodate at least a part of the decoupling capacitor.

Embodiments can be freely combined, and each of Embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a first semiconductor integrated circuit including at least a first terminal and a second terminal;
a first lead frame connected to the first terminal;
a second lead frame connected to the second terminal;
a mold resin covering the first semiconductor integrated circuit; and
a switching element covered by the mold resin and connected to the first semiconductor integrated circuit, wherein
the mold resin further covers the first lead frame with a portion of the first lead frame being exposed,
the mold resin further covers the second lead frame with a tip of the second lead frame opposite to the second terminal being exposed, and
the mold resin includes a recess, and in the recess, only the portion of the first lead frame and the mold resin are exposed, and the recess is configured to accommodate at least a part of a bootstrap circuit comprising a capacitor such that rendering the switching element conductive would charge the capacitor of the bootstrap circuit.

2. The semiconductor device according to claim 1, wherein
a tip of the first lead frame opposite to the first terminal is uncovered by the mold resin, and
the portion of the first lead frame is interposed between the tip of the first lead frame and the first terminal.

3. The semiconductor device according to claim 2, wherein
the portion of the first lead frame is bent in the recess, the portion of the first lead frame including a plurality of layers when viewed along a depth direction of the recess.

4. The semiconductor device according to claim 1, further comprising:
a current-limiting circuit covered by the mold resin and connected to the first semiconductor integrated circuit, wherein
rendering the switching element conductive would charge the capacitor of the bootstrap circuit through the current-limiting circuit.

5. A semiconductor device, comprising:
a first semiconductor integrated circuit including at least a first terminal and a second terminal;
a first lead frame connected to the first terminal;
a second lead frame connected to the second terminal;
a mold resin covering the first semiconductor integrated circuit;
a diode having a first end and a second end connected to the first lead frame;
a second semiconductor integrated circuit;
a third lead frame;
a fourth lead frame;
a first switching element covered by the mold resin and connected between the third lead frame and the second lead frame, the first switching element being controlled by the first semiconductor integrated circuit; and
a second switching element covered by the mold resin and connected between the second lead frame and the fourth lead frame, the second switching element being controlled by the second semiconductor integrated circuit, wherein
the mold resin further covers the first lead frame with a portion of the first lead frame being exposed,
the mold resin further covers the second lead frame with a tip of the second lead frame opposite to the second terminal being exposed,
the mold resin includes a recess, and in the recess, only the portion of the first lead frame and the mold resin are exposed,
the first semiconductor integrated circuit further includes a third terminal connected to the first end of the diode, and
the recess is shaped to accommodate at least a part of a capacitor to be charged through the diode by rendering the second switching element conductive.

6. The semiconductor device according to claim 5, wherein
a tip of the first lead frame opposite to the first terminal is uncovered by the mold resin, and
the portion of the first lead frame is interposed between the tip of the first lead frame and the first terminal.

7. The semiconductor device according to claim 6, wherein
the portion of the first lead frame is bent in the recess, the portion of the first lead frame including a plurality of layers when viewed along a depth direction of the recess.

8. The semiconductor device according to claim 5, wherein
the portion of the first lead frame is bent in the recess, the portion of the first lead frame including a plurality of layers when viewed along a depth direction of the recess.

9. A semiconductor device, comprising:
a first semiconductor integrated circuit including at least a first terminal and a second terminal;
a first lead frame connected to the first terminal;
a second lead frame connected to the second terminal; and
a mold resin covering the first semiconductor integrated circuit, wherein
the mold resin further covers the first lead frame with a portion of the first lead frame being exposed,
the mold resin further covers the second lead frame with a tip of the second lead frame opposite to the second terminal being exposed,
the mold resin includes a recess, and in the recess, only the portion of the first lead frame and the mold resin are exposed, and
the portion of the first lead frame is bent in the recess, the portion of the first lead frame including a plurality of layers when viewed along a depth direction of the recess.

* * * * *